(12) United States Patent
Hagiwara

(10) Patent No.: US 9,414,488 B2
(45) Date of Patent: Aug. 9, 2016

(54) CIRCUIT BOARD FOR MOUNTING ELECTRONIC COMPONENTS

(71) Applicant: CANON KABUSHIKI KAISHA, Tokyo (JP)

(72) Inventor: Yuichi Hagiwara, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 106 days.

(21) Appl. No.: 14/364,171

(22) PCT Filed: Jan. 24, 2013

(86) PCT No.: PCT/JP2013/052118
§ 371 (c)(1),
(2) Date: Jun. 10, 2014

(87) PCT Pub. No.: WO2013/121882
PCT Pub. Date: Aug. 22, 2013

(65) Prior Publication Data
US 2014/0374152 A1  Dec. 25, 2014

(30) Foreign Application Priority Data
Feb. 17, 2012  (JP) ................................ 2012-033351

(51) Int. Cl.
*H05K 1/11* (2006.01)
*H05K 3/34* (2006.01)

(52) U.S. Cl.
CPC .................. *H05K 1/11* (2013.01); *H05K 1/111* (2013.01); *H05K 3/3436* (2013.01); *H01L 2224/48091* (2013.01); *H01L 2224/48227* (2013.01); *H01L 2924/15311* (2013.01); *H05K 2201/094* (2013.01); *H05K 2201/10734* (2013.01); *H05K 2203/159* (2013.01); *H05K 2203/1572* (2013.01); *Y02P 70/611* (2015.11); *Y02P 70/613* (2015.11)

(58) Field of Classification Search
CPC ........................................................ H05K 1/11
USPC ............................................ 174/261; 361/760
See application file for complete search history.

(56) References Cited

U.S. PATENT DOCUMENTS

| 8,379,400 B2 | 2/2013 | Sunohara | |
|---|---|---|---|
| 2002/0061665 A1* | 5/2002 | Batinovich | H01L 21/4853 439/71 |
| 2005/0023033 A1* | 2/2005 | Saiki | H05K 3/305 174/260 |
| 2007/0259480 A1* | 11/2007 | Sundstrom | H05K 3/341 438/108 |
| 2009/0298228 A1 | 12/2009 | Sato et al. | |
| 2011/0233786 A1* | 9/2011 | Homma | H01L 21/561 257/773 |

FOREIGN PATENT DOCUMENTS

| JP | 3-12993 A | 1/1991 |
|---|---|---|
| JP | 9-27678 A | 1/1997 |

(Continued)

*Primary Examiner* — Timothy Thompson
*Assistant Examiner* — Charles Pizzuto
(74) *Attorney, Agent, or Firm* — Fitzpatrick, Cella, Harper & Scinto

(57) ABSTRACT

In a circuit board for mounting electronic components, in which electronic components are to be mounted on its two surfaces by a reflow soldering process, the sizes of lands on the primary and secondary surfaces of the circuit board are set different from each other when chips having the same shape are to be mounted on both the primary and secondary surfaces of the circuit board.

7 Claims, 4 Drawing Sheets

(56) References Cited

FOREIGN PATENT DOCUMENTS

| | | | |
|---|---|---|---|
| JP | 2007-149828 A | 6/2007 | |
| JP | 2010-10644 A | 1/2010 | |
| JP | 2011-82293 A | 4/2011 | |
| JP | 2011-204765 A | 10/2011 | |
| KR | 100648040 B1 * | 11/2006 | ........ H01L 23/49811 |

* cited by examiner

CIRCUIT BOARD FOR MOUNTING ELECTRONIC COMPONENTS

TECHNICAL FIELD

The present invention relates to a circuit board for mounting electronic components and, more particularly, to a circuit board for mounting electronic components, in which chips are to be mounted on its two surfaces.

BACKGROUND ART

In recent years, a leadless BGA (Ball Grid Array) is adopted as one type of component package for a high-density circuit board for mounting electronic components. This is because electronic components can be packaged in a BGA at a density higher than that of a package having terminals disposed on a peripheral portion, such as a QFP (Quad Flat Package) having a lead on the periphery of a semiconductor package, so the use of a BGA makes it easy to form a multipin structure. In addition, electronic components can be collectively packaged in a BGA upon a so-called reflow soldering process. The reflow soldering means herein a process of printing a solder paste (a material obtained by kneading a solder powder and a flux with each other into a paste) on lands of a circuit board for mounting electronic components, and heating the circuit board as the electronic components are mounted in it to melt, for example, the printed solder balls (also called bumps), thereby soldering the electronic components to the circuit board.

Japanese Patent Laid-Open No. 2007-149828 discloses a circuit board for mounting, by a reflow soldering, electronic components in which a plurality of solder balls are two-dimensionally arranged on their surfaces in, for example, a BGA. In this circuit board for mounting electronic components, due to its warpage, failures in connection of the solder balls occur more frequently on the periphery of the BGA than at or near the center of the BGA. Hence, the size of the land of each solder ball on the periphery of the BGA is set larger than that of the land of each solder ball at or near the center of the BGA. In general, as the size of the land of each solder ball increases, the bonding area with the solder increases, so the surface tension (self-alignment effect) of this solder ball upon melting also increases. Hence, the circuit board can withstand external stresses such as warpage of the circuit board.

However, as in the above-mentioned circuit board for mounting electronic components described in Japanese Patent Laid-Open No. 2007-149828, when the size of the land of an interposer of a BGA chip is set differently to that of the land of the circuit board, the following problem is posed. That is, when a BGA chip is mounted on the secondary surface of the circuit board, the following phenomenon may occur, leading to failures in connection of the solder balls.

The phenomenon in which a failure in connection of any of solder balls 307 occurs in a BGA chip 303 on the secondary surface of a circuit board 301 will be explained with reference to FIGS. 3 and 4.

FIG. 3 depicts a sectional view showing the circuit board 301, in which its secondary surface (its upper surface in FIG. 3) is reflow soldered first, and the BGA chip 303 is mounted. To attain a strong solder bond, the size of a land 311 of the circuit board 301 is set larger than that of a land 310 of an interposer 305 of the BGA chip 303, as shown in FIG. 3.

After the secondary surface of the circuit board 301 is thus reflow soldered, the primary surface of the circuit board 301 (its upper surface in FIG. 4) is reflow soldered next. Note that as shown in FIG. 4, during the reflow soldering process of the primary surface of the circuit board 301, the BGA chip 303 is present below the circuit board 301, so a force acts on the BGA chip 303 downwards in a direction indicated by an arrow 401 by the action of gravity. Also, as the circuit board 301 is heated by reflow soldering process of its primary surface, the solder balls 307 on the secondary surface of the circuit board 301 melt. At this time, since the surface tension of the solder is proportional to the size of the land, (Surface Tension of Interposer)<(Surface Tension of Circuit Board), and this means that the solder ball 307 is pulled toward the land 311 of the circuit board 301. As a result, the solder on the smaller land, that is, the solder on the land of the interposer 305 is cut, leading to a failure in connection.

SUMMARY OF INVENTION

An aspect of the present invention is to eliminate the above-mentioned problems which are found in the conventional technology.

A feature of the present invention is to provide a technique for reducing the rate of failure in mounting a chip on the surface of a circuit board, on which electronic components are mounted first, when chips are to be mounted on the two surfaces of the circuit board by a reflow soldering process.

According to an aspect of the present invention, there is provided a circuit board for mounting electronic components, in which electronic components are to be mounted on both a primary surface and a secondary surface thereof by a reflow soldering process, wherein sizes of lands on the primary surface and the secondary surface of the circuit board, on which chips having a substantially identical shape are to be mounted, are set different from each other.

Further features of the present invention will become apparent from the following description of exemplary embodiments with reference to the attached drawings.

BRIEF DESCRIPTION OF DRAWINGS

The accompanying drawings, which are incorporated in and constitute a part of the specification, illustrate embodiments of the invention and, together with the description, serve to explain the principles of the invention.

DESCRIPTION OF EMBODIMENTS

Embodiments of the present invention will be described hereinafter in detail, with reference to the accompanying drawings. It is to be understood that the following embodiments are not intended to limit the claims of the present invention, and that not all of the combinations of the aspects that are described according to the following embodiments are necessarily required with respect to the means to solve the problems according to the present invention.

Figure 1:
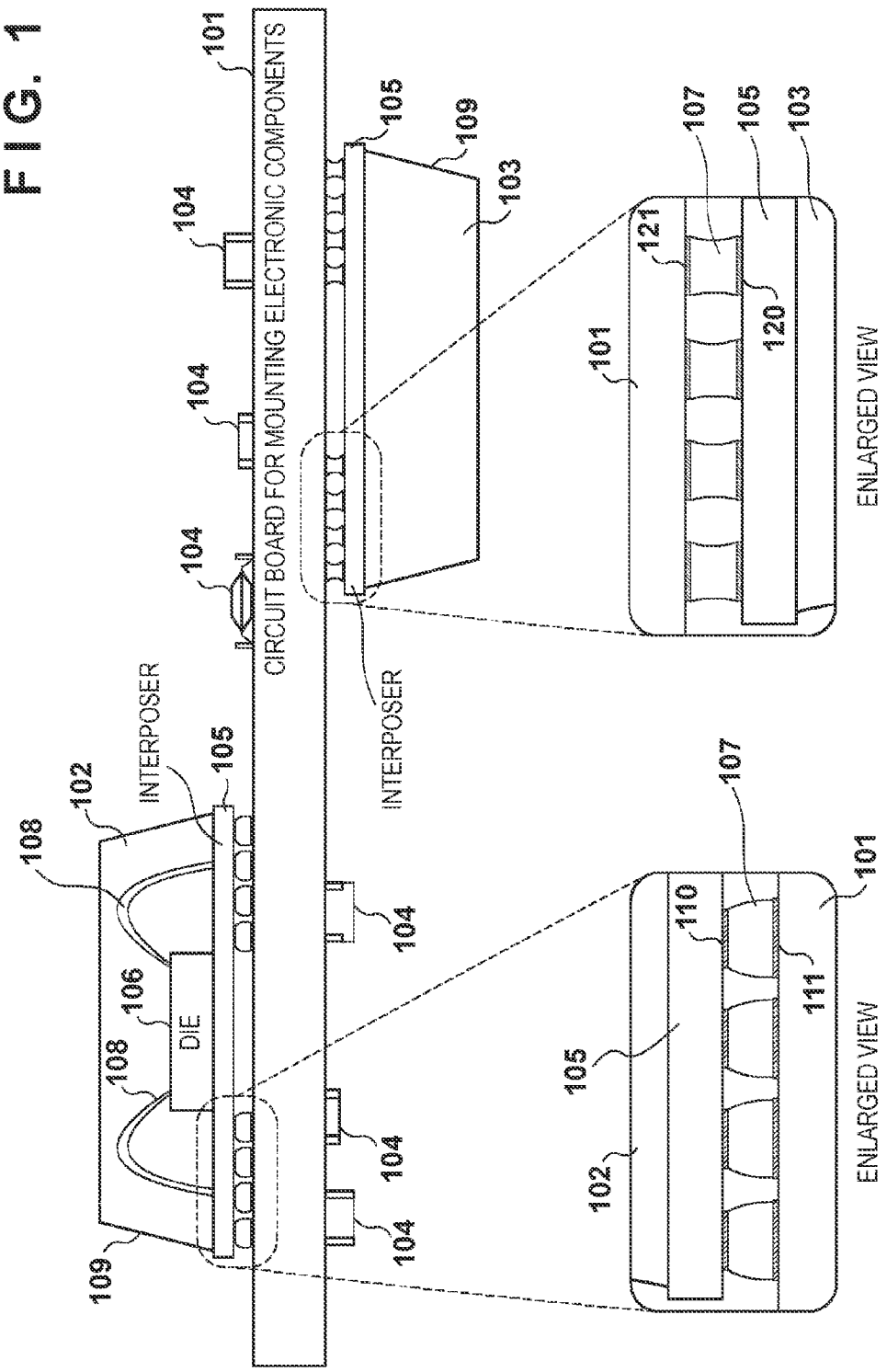
FIG. 1 depicts a sectional view showing the configuration of a circuit board for mounting electronic components according to an embodiment of the present invention.

FIG. 1 depicts a sectional view showing the configuration of a circuit board 101 for mounting electronic components according to an embodiment of the present invention.

BGA chips 102 and 103 in packages with the same shape, and electronic components 104 including resistors and capacitors other than BGA chips are mounted on the two surfaces of the circuit board 101 for mounting electronic components. The packages with the same shape mean herein packages including interposers 105 with the same land size and land pitch. Referring to FIG. 1, the circuit board 101 includes the BGA chip 102 mounted on its primary surface (on its upper surface in FIG. 1), and the BGA chip 103 mounted on its secondary surface (on its lower surface in FIG. 1). The case wherein the BGA chip 103 is mounted on the secondary surface of the circuit board 101 by reflow soldering process of the secondary surface first, and the BGA chip 102 is mounted on the primary surface of the circuit board 101 by reflow soldering process of the primary surface next will be described herein.

The BGA chip 102 includes an interposer 105, a die 106, solder balls 107, wire bonding 108, and an encapsulation resin 109. The interposer 105 has its one surface on which the die 106 is mounted as an integrated circuit including active and passive elements, and its other surface bonded to the circuit board 101 for mounting electronic components (the BGA chips 102 and 103), via the solder balls 107. Note that the solder balls 107 bond lands 110 of the interposer 105 and lands 111 of the circuit board 101 to each other by a reflow soldering process. Also, the die 106 is electrically connected to the interposer 105 via the wire bonding 108. Moreover, the die 106 is encapsulated in the interposer 105 by the encapsulation resin 109. Note that the configuration of the BGA chip 103 on the secondary surface is the same as in the BGA chip 102, and a description thereof will not be given.

The size of the land 110 of the interposer 105 and that of the land 111 of the circuit board 101 will be described.

In the BGA chip 103 on the secondary surface, the size of a land 121 of the circuit board 101 is set equal to that of a land 120 of the interposer 105, as shown in FIG. 1. On the other hand, in the BGA chip 102 on the primary surface, the size of the land 111 of the circuit board 101 is set larger than that of the land 110 of the interposer 105 to attain a strong solder bond.

Figure 2:
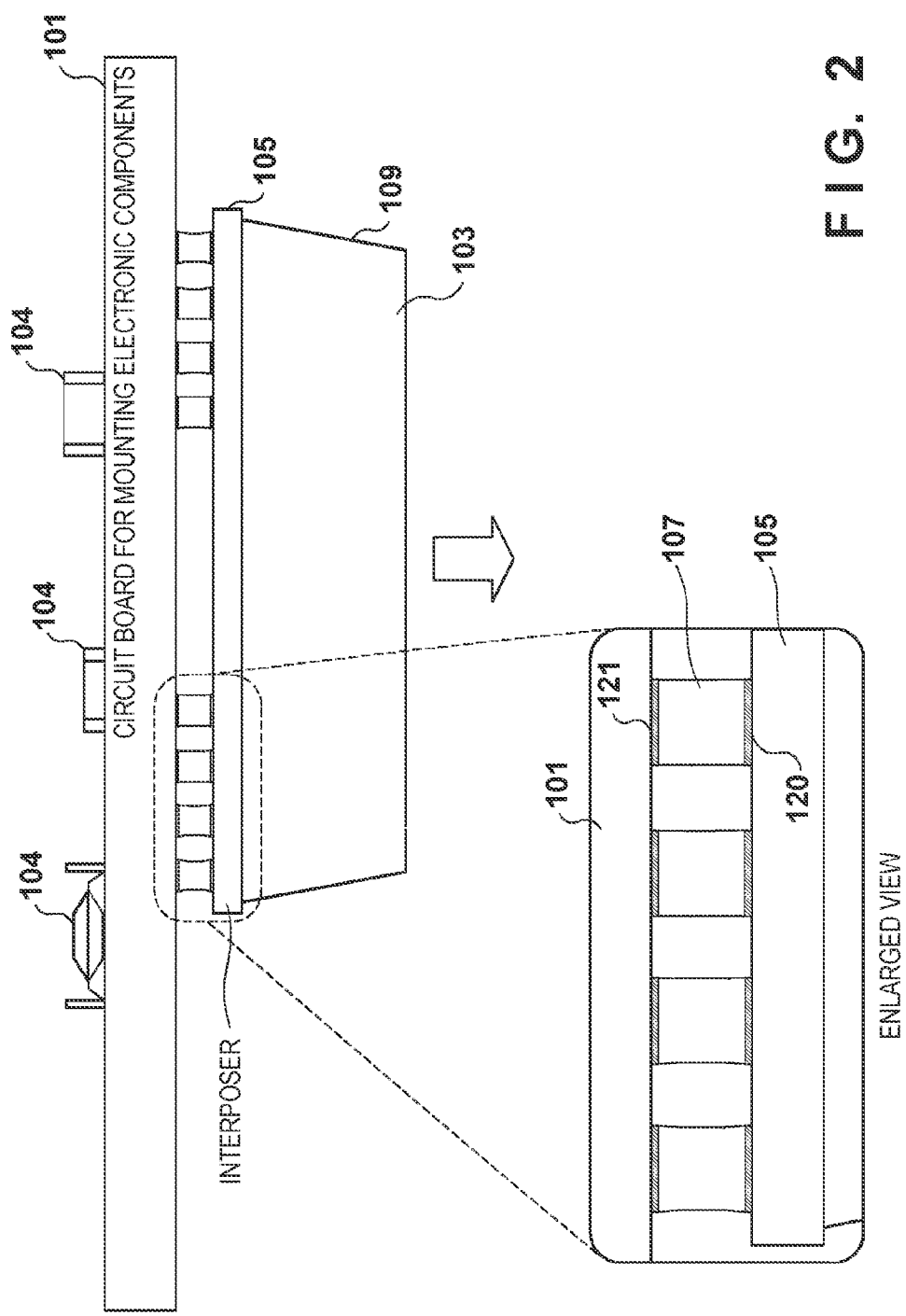
FIG. 2 depicts a sectional view showing the circuit board for mounting electronic components during the reflow soldering process of its primary surface according to the embodiment of the present invention.
Figure 3:
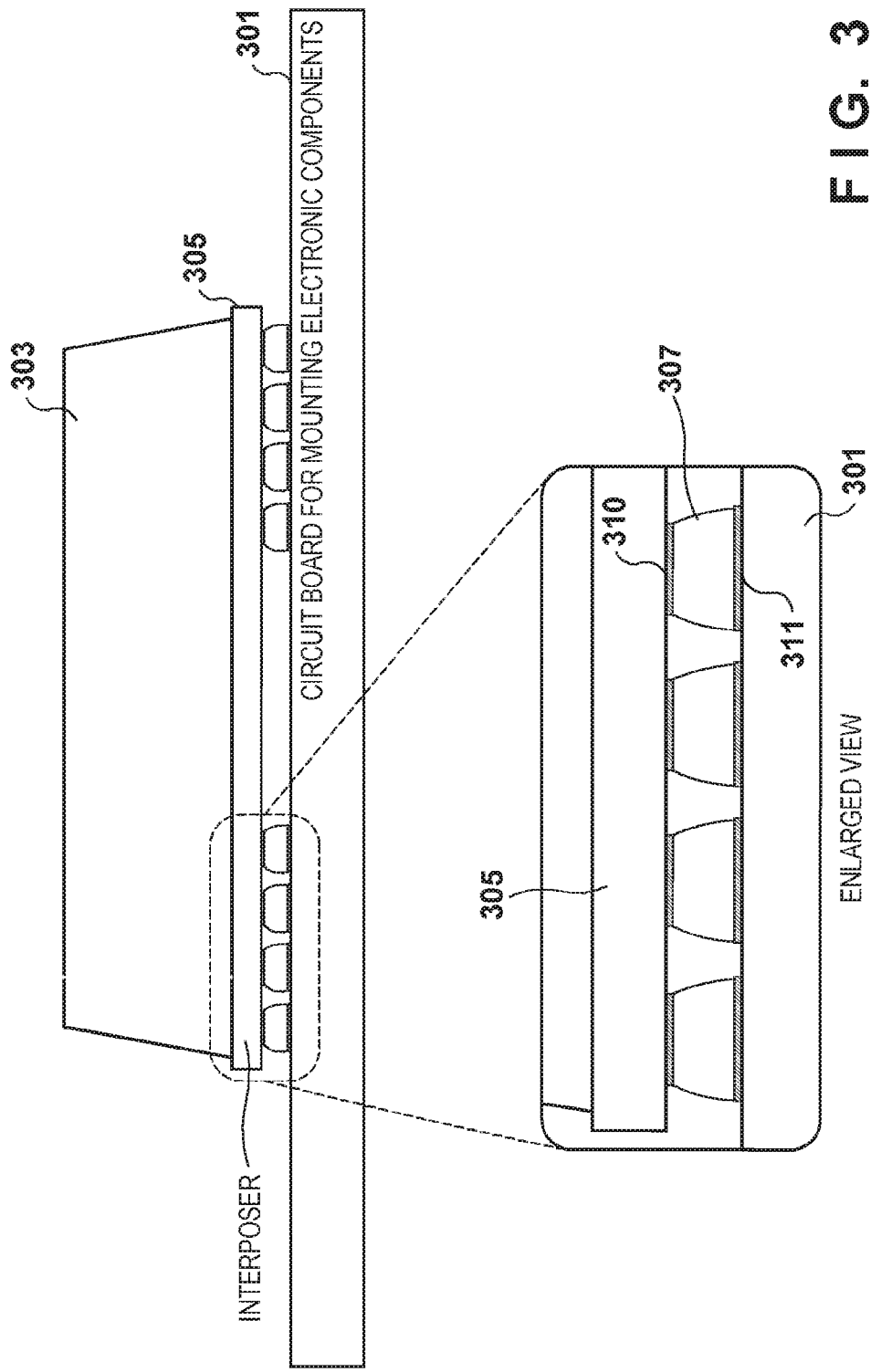
FIG. 3 depicts a sectional view showing a circuit board for mounting electronic components during the reflow soldering process of its secondary surface in the conventional technique.
Figure 4:
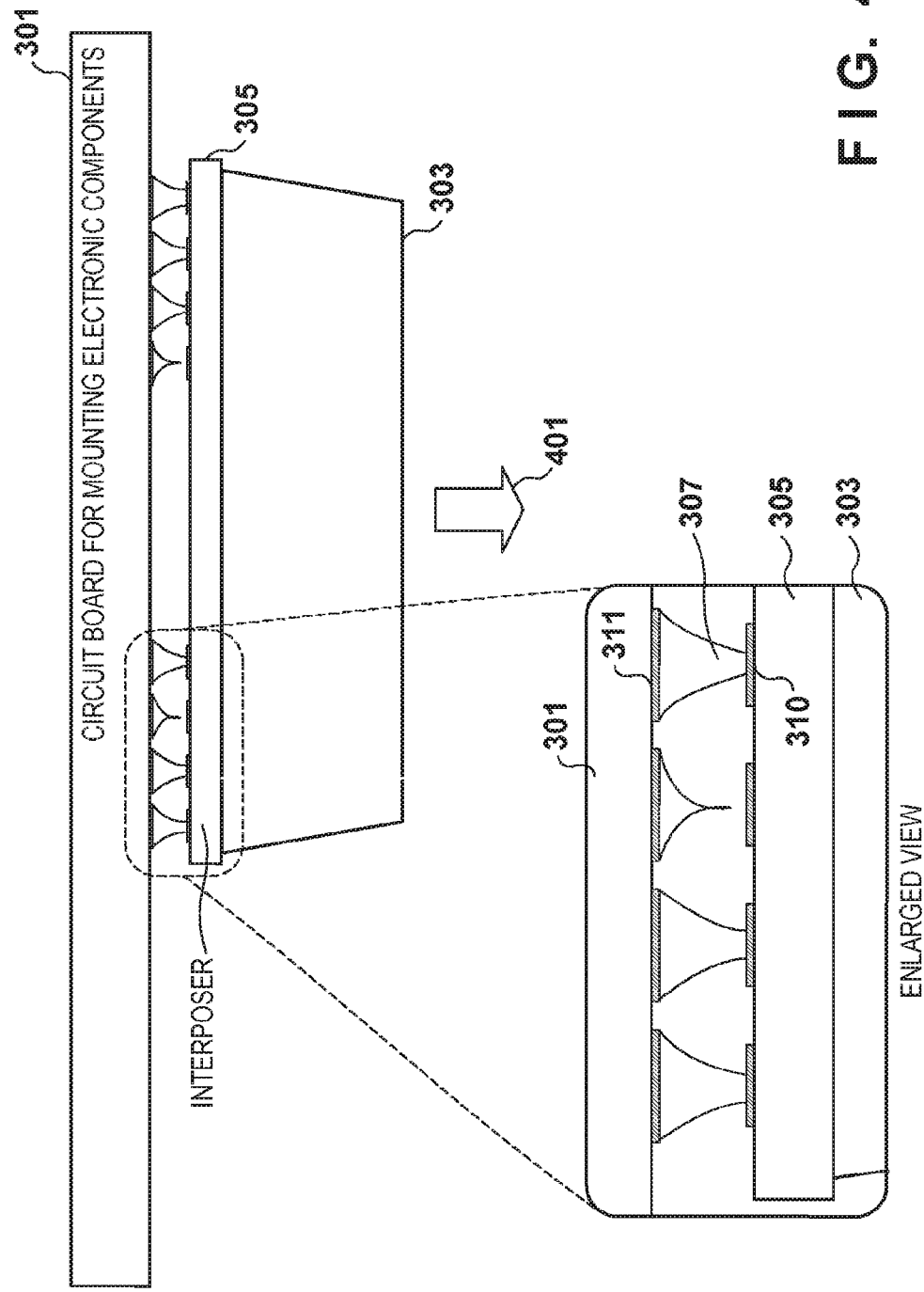
FIG. 4 depicts a sectional view showing the circuit board for mounting electronic components during the reflow soldering process of its primary surface in the conventional technique.

With this operation, after the secondary surface has been reflow soldered, when the primary surface is to be reflow soldered, the surface tensions of the interposer 105 and circuit board 101 become equal to each other in the BGA chip 103 on the secondary surface, as shown in FIG. 2. As a result, equal forces act on the solder balls 107 from the two sides between the circuit board 101 and the interposer 105 of the BGA chip 103. Hence, compared to the conventional case wherein one of the circuit board 101 and the interposer 105 has lands smaller than the other, the solder balls 107 are harder to cut, thereby reducing the rate of failure in mounting.

As described above, according to this embodiment, when BGA chips are to be mounted on the two surfaces of the circuit board 101, the size of the land of the circuit board is set equal to that of the land of the interposer of the BGA chip on the secondary surface, which is mounted first. This makes it possible to reduce the rate of failure in mounting the BGA chip on the secondary surface during the reflow soldering process of the primary surface of the circuit board.

Although a chip is mounted on the secondary surface first, and another chip is mounted on the primary surface next in this embodiment, the present invention is not limited to this, and the order of mounting may be reversed. In this case, the size of the land of the circuit board is set equal to that of the land of the interposer of the BGA chip on the primary surface, which is mounted first.

Also, although the size of the land of the circuit board is set equal to that of the land of the interposer of the BGA chip on one surface, which is mounted first, in the above-mentioned embodiment, these sizes need not always be exactly equal to each other. That is, the size of the land on one surface of the circuit board, on which a chip is mounted first, may be set slightly larger than that of the land of the interposer of the mounted chip.

Moreover, although the chips to be mounted on the primary and secondary surfaces of the circuit board are included in packages having interposers with the same land size and land pitch, the present invention is not limited to this. That is, these two interposers may have slightly different land sizes and land pitches.

According to this embodiment, when chips are to be mounted on the two surfaces of a circuit board, the size of the land of the circuit board is set equal to that of the land on the primary or secondary surface of the circuit board, on which a chip is to be mounted first, thereby reducing the rate of failure in mounting the chip on either surface first.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-033351, filed Feb. 17, 2012, which is hereby incorporated by reference herein in its entirety.

The invention claimed is:

1. A circuit board for mounting electronic components, in which electronic components are to be mounted on both a primary surface and a secondary surface, wherein
   a size of a land of the primary surface of the circuit board, on which a first electronic component is to be mounted, is greater than a size of a land of the secondary surface of the circuit board, on which a second electronic component is to be mounted.

2. The board according to claim 1, wherein the first and second electronic components to be respectively mounted on the primary surface and the secondary surface have a substantially identical shape and include interposers having substantially equal land sizes and land pitches.

3. The board according to claim 1, wherein the first and second electronic components include BGA chips.

4. A circuit board for mounting electronic components, in which electronic components are to be mounted on both a primary surface and a secondary surface, wherein
   a size of a land of the primary surface of the circuit board, on which a first electronic component is mounted, is greater than a size of a land of the first electronic component, and
   a size of a land of the secondary surface of the circuit board, on which a second electronic component is mounted, is equal to a size of a land of the second electronic component.

5. The board according to claim 4, wherein the size of the land of the primary surface of the circuit board is greater than the size of the land of the secondary surface of the circuit board.

6. A circuit board for mounting electronic components, in which electronic components are to be mounted on both a primary surface and a secondary surface, wherein a size of a land of the secondary surface of the circuit board, on which an interposer of a first electronic component is mounted by a first reflow soldering process, is equal to a size of a land of the interposer of the first electronic component, and a size of a land of the primary surface of the circuit board, on which an interposer of a second electronic component is mounted by a second reflow soldering process following the first reflow soldering process, is greater than a size of a land of the interposer of the second electronic component.

7. The board according to claim 6, wherein interposers of the first and second electronic components have substantially equal land sizes and land pitches.

* * * * *